(12) United States Patent
Huynh et al.

(10) Patent No.: US 7,167,369 B1
(45) Date of Patent: Jan. 23, 2007

(54) METHODS AND APPARATUS FOR INSTALLING A HEAT SINK USING SURFACE MOUNT TECHNOLOGY

(75) Inventors: Hong Huynh, Fremont, CA (US); Anthony King, San Jose, CA (US); Susheela Narasimhan, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 314 days.

(21) Appl. No.: 10/730,524

(22) Filed: Dec. 8, 2003

(51) Int. Cl.
*H05K 7/20* (2006.01)

(52) U.S. Cl. .................. 361/719; 361/704; 257/727; 24/625; 165/80.3

(58) Field of Classification Search ............ 361/719, 361/704, 710; 257/726–727; 24/625; 174/16.3; 248/505; 439/83, 86; 165/80.3
See application file for complete search history.

(56) References Cited

U.S. PATENT DOCUMENTS

| | | | | |
|---|---|---|---|---|
| 4,991,059 A | * | 2/1991 | Kiyose | 361/773 |
| 5,148,349 A | * | 9/1992 | Kogure et al. | 361/690 |
| 5,249,977 A | * | 10/1993 | Tanaka et al. | 439/135 |
| 5,270,492 A | * | 12/1993 | Fukui | 174/52.4 |
| 5,346,118 A | * | 9/1994 | Degani et al. | 228/180.22 |
| 5,640,305 A | * | 6/1997 | Smithers | 361/719 |
| 5,786,989 A | * | 7/1998 | Kawabe | 361/759 |
| 6,208,517 B1 | * | 3/2001 | Prince et al. | 361/704 |
| 6,222,734 B1 | * | 4/2001 | Bookhardt et al. | 361/719 |
| 6,552,277 B1 | * | 4/2003 | Downes | 174/267 |
| 6,590,771 B2 | * | 7/2003 | Sopko et al. | 361/704 |
| 6,623,283 B1 | * | 9/2003 | Torigian et al. | 439/83 |
| 6,714,416 B1 | | 3/2004 | McLeod et al. | 361/719 |
| 6,775,138 B2 | * | 8/2004 | Lee et al. | 361/697 |
| 6,813,155 B2 | | 11/2004 | Lo | 361/687 |
| 6,826,051 B2 | | 11/2004 | Lai et al. | 24/295 |
| 6,826,054 B2 | | 11/2004 | Liu | 361/689 |
| RE38,677 E | | 12/2004 | Blomquist | 24/453 |
| 6,829,144 B1 | | 12/2004 | Stutzman et al. | 361/704 |
| 6,835,898 B2 | | 12/2004 | Eldridge et al. | 174/267 |
| 6,856,511 B1 | | 2/2005 | Viernes et al. | 361/704 |

* cited by examiner

*Primary Examiner*—Michael Datskovsky
*Assistant Examiner*—Robert J. Hoffberg
(74) *Attorney, Agent, or Firm*—BainwoodHuang

(57) ABSTRACT

A circuit board module includes a circuit board having surface mount pads, a circuit board component mounted to the circuit board, and a heat sink assembly. The heat sink assembly includes a heat sink, a first clip holder and a second clip holder. Each clip holder is mounted to respective surface mount pads of the circuit board using a surface mount technology soldering process. The heat sink assembly further includes a clip having a first portion configured to fasten to the first clip holder, a second portion configured to fasten to the second clip holder, and a third portion coupled to the first and second portions. The third portion is configured to position the heat sink adjacent the circuit board component when the first and second portions are respectively fastened to the first and second clip holders.

12 Claims, 5 Drawing Sheets

METHODS AND APPARATUS FOR INSTALLING A HEAT SINK USING SURFACE MOUNT TECHNOLOGY

BACKGROUND

In general, a heat sink is a thermally conductive device that dissipates heat from one or more circuit board components into the surrounding air. An air stream generated by a fan assembly then carries the heat away. Such operation enables the circuit board components to operate in a lower temperature range without increasing the likelihood of operating incorrectly and/or sustaining damage. Examples of circuit board components that use heat sinks include high speed processors, Field Programmable Gate Arrays, and optical transceivers.

There are a variety of conventional approaches for mounting a heat sink to a circuit board component. One conventional approach (hereinafter referred to as the "adhesive approach") involves the circuit board manufacturer (or supplier) affixing the heat sink to the component package with an adhesive (e.g., tape, glue, combinations thereof, etc.) having a high thermal transfer coefficient. In this approach, the manufacturer applies the adhesive between the circuit board component and the heat sink. Glue-like material within the adhesive then cures to fasten the heat sink directly to the outer surface of the component package. Accordingly, when the component is in operation, the heat sink, which is now held firmly in place by the adhesive, conveys heat from the component into the surrounding air.

Another conventional approach (hereinafter referred to as the "fastener approach") involves the circuit board manufacturer providing mounting holes in circuit board locations surrounding the circuit board component. In this approach, the manufacturer then installs standoffs (i.e., threaded metallic posts, nuts, and perhaps other loose hardware) on the circuit board through the mounting holes, and places the heat sink over the top of the component, perhaps with thermal transfer material disposed between the heat sink and the top of the component package to facilitate heat transfer therebetween. Next, the manufacturer rigidly secures the heat sink to the standoffs. As a result, when the component is in operation, the heat sink, which is now held rigidly in place by the standoffs, conducts heat from the component and dissipates that heat into a neighboring air stream.

In yet another conventional approach (hereinafter referred to as the "anchor-in-hole approach"), the circuit board manufacturer solders U-shaped anchors into plated through holes (PTHs) of the circuit board. This soldering step is typically performed manually by a technician after performance of a surface mount soldering process in which all of the circuit board components are mounted to the circuit board. After the technician manually solders the U-shaped anchors into place, the technician places a heat sink over the circuit board component, and hooks the ends of a spring wire clip through the U-shaped anchors. Tension between the spring wire clip and the heat sink holds the heat sink properly in place over the circuit board component.

SUMMARY

Unfortunately, there are deficiencies to the above-described conventional approaches to mounting a heat sink to a circuit board component. For example, in connection with the above-described conventional adhesive approach, the adhesive is prone to failure over time. In particular, as the glue-like material within the adhesive ages, it tends to becomes brittle as well as lose its elasticity and holding strength. Eventually, the combination of time, vibration and high temperature cause the adhesive's holding characteristics to deteriorate to the point where the heat sink separates from the circuit board component. In some heat sink separation situations, the loss of the heat sink's cooling operation and/or uncontrolled movement of the heat sink may result in damage to circuit board components or the circuit board itself. Furthermore, even if the adhesive successfully maintains its holding characteristics, there may be situations in which a technician would like to remove the heat sink (e.g., to rework the circuit board component, etc.). In such situations, it is an ugly process for the technician to remove the heat sink from the component, and any adhesive remaining on the heat sink tends to hinder the heat sink's thermal transfer capabilities thus rendering the heat sink unsalvageable.

Additionally, in the both above-described conventional fastener approach and the anchor-in-hole approach, the circuit board manufacturer must sacrifice space immediately around the circuit board component to enable attachment of penetrating elements (i.e., standoffs or anchors). In particular, the manufacturer must sacrifice a significant amount of circuit board real estate in order to provide mounting holes and associated keep-out regions (i.e., anti-pads). The inner layer real estate around the circuit board component is often particularly precious since the component typically has a high density of contacts (e.g., a Ball Grid Array, a Ceramic Column Grid Array, etc.) which must electrically connect to pads and traces leading to other locations of the circuit board. If the manufacturer did not need to sacrifice this inner layer real estate to accommodate the standoffs or anchors, the manufacturer could utilize such space for other purposes (e.g., signal traces leading to and from the component mounting location, etc.). Moreover, even if circuit board space is adequate, the manufacturer risks damaging the circuit board when the manufacturer installs the standoffs or anchors onto the circuit board, e.g., the loose hardware can scratch or cut surface traces if dropped onto the circuit board, debris associated with the loose hardware can fall off the loose hardware and contaminate the circuit board, etc.

In contrast to the above-described conventional approaches to mounting a heat sink to a circuit board, embodiments of the invention are directed to techniques for installing a heat sink using surface mount technology (SMT). In particular, heat sink clip holders solder to a circuit board using an SMT soldering process, and a clip subsequently fastens to the heat sink clip holders to properly position a heat sink relative to a circuit board component mounted to the circuit board. Accordingly, there is no adhesive required and the heat sink is removable if desired (e.g., during a rework process). Additionally, there is no need to sacrifice real estate in the inner layers of the circuit board for any standoffs or anchors.

One embodiment of the invention is directed to a circuit board module which includes a circuit board having surface mount pads, a circuit board component mounted to the circuit board, and a heat sink assembly. The heat sink assembly includes a heat sink, a first clip holder and a second clip holder. Each clip holder is mounted to respective surface mount pads of the circuit board using a surface mount technology soldering process (e.g., the same soldering process used to mount the component). The heat sink assembly further includes a clip having a first portion configured to fasten to the first clip holder, a second portion configured to fasten to the second clip holder, and a third portion coupled to the first and second portions. The third portion is configured to position the heat sink adjacent to the circuit board component when the first and second portions are respectively fastened to the first and second clip holders.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for installing a heat sink using surface mount technology (SMT). Such techniques involve the use of (i) heat sink clip holders which solder to a circuit board using an SMT soldering process, and (ii) a clip which subsequently fastens to the heat sink clip holders to properly position a heat sink relative to a circuit board component mounted to the circuit board. As a result, there is no adhesive required and the heat sink is removable if desired (e.g., during a rework process). Furthermore, there is no need to sacrifice real estate, thus disrupting the routing of traces on in the inner layers of the circuit board, for any standoffs or anchors.

Figure 1:
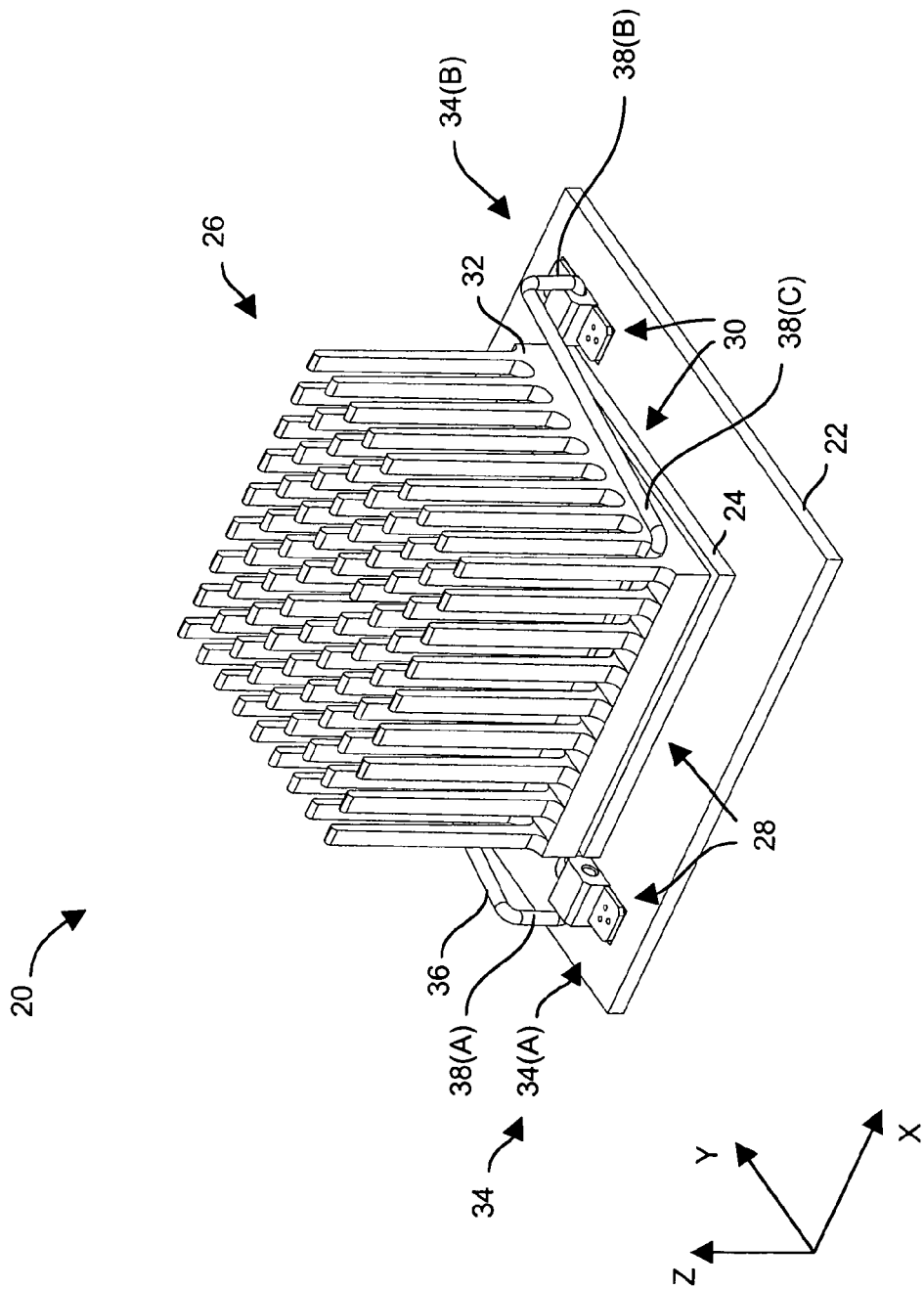
FIG. 1 is a perspective view of a portion of a circuit board module which is suitable for use by the invention.

FIG. 1 shows a portion of a circuit board module 20 which is suitable for use by the invention. The circuit board module 20 includes a circuit board 22, a circuit board component 24, and a heat sink assembly 26. As will be explained in further detail below, the circuit board 22 includes surface mount pads 28 (shown generally in FIG. 1 by the arrow 28) for mounting the circuit board component 24 and parts of the heat sink assembly 26 using an SMT soldering process. As a result, robust and reliable solder joints 30 (see the arrow 30 in FIG. 1) hold both the component 24 and portions of the heat sink assembly 26 in place relative to the circuit board 22.

As shown in FIG. 1, the heat sink assembly 26 includes a heat sink 32, a first clip holder 34(A) and a second clip holder 34(B) (collectively, heat sink clip holders 34), and a clip 36 (e.g., a wire clip). The clip 36 includes a first portion 38(A) configured to fasten to the first clip holder 34(A), a second portion 38(B) configured to fasten to the second clip holder 34(B), and a third portion 38(C) coupled to the first and second portions 38(A), 38(B). The third portion 38(C) is configured to position the heat sink 32 adjacent the circuit board component 24 when the first and second portions 38(A), 38(B) are respectively fastened to the first and second clip holders 34(A), 34(B). Further details of the invention will now be provided with reference to FIG. 2.

Figure 2:
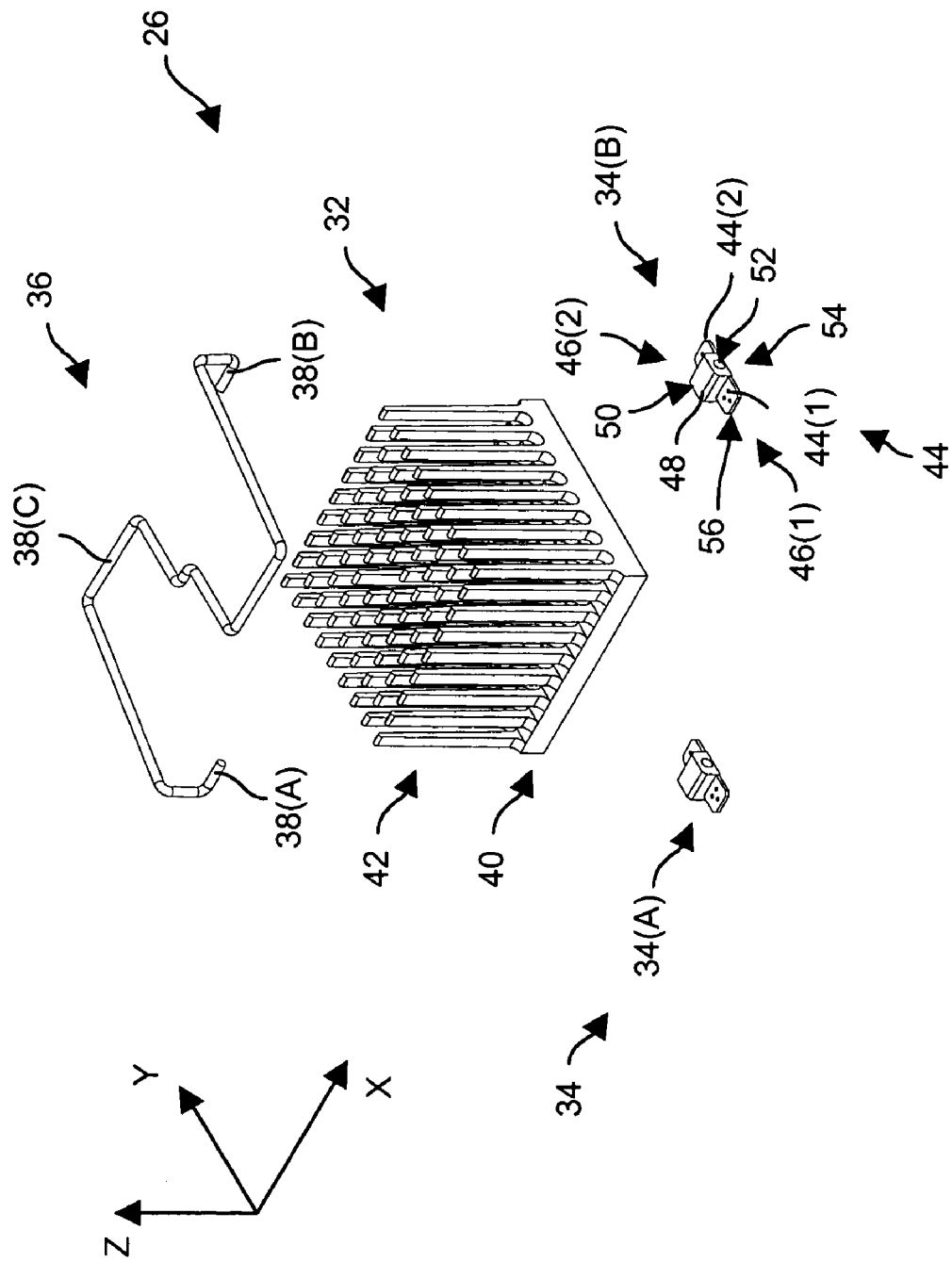
FIG. 2 is an exploded view of a heat sink assembly of the circuit board module of FIG. 1.

FIG. 2 is an exploded view of the heat sink assembly 26. The heat sink 32 includes a component connecting portion 40 and a heat dissipation portion 42 coupled to the component connection portion 40. Accordingly, when the component connecting portion 40 is in thermal communication with the circuit board component 24 (FIG. 1), heat travels from the component 24 through the component connecting portion 40 to the heat dissipation portion 42 where the heat dissipates into the surrounding environment (e.g., into an air stream that carries the heat away). It should be understood that the heat sink 32 can be made from a variety of thermally conductive materials such as aluminum, copper, etc. Furthermore, a thermal interface material can be positioned between the heat sink 32 and the circuit board component 24 to enhance the communication properties.

As further shown in FIG. 2, each clip holder 34 is generally elongated in shape and includes (i) a first surface mount contact 44(1) at a first end 46(1) and (ii) a second surface mount contact 44(2) at a second end 46(2) opposite the first end 46(1). Each clip holder 34 further includes a body 48 interconnected between the first and second surface mount contacts 44(1), 44(2) (collectively, surface mount contacts 44). The body 48 defines an interfacing surface 50 and a cavity 52. The interfacing surface 50 enables automated pick-and-place equipment to properly grab and position the clip holder 34 during the SMT soldering process (e.g., the interfacing surface 50 accommodates a vacuum nozzle in a similar manner to that of an integrated circuit package). The cavity 52 is configured to receive an end portion 38(A), 38(B) of the clip 36 when later fastening the heat sink 32 to the circuit board component 24 (FIG. 1).

In some arrangements, the surface mount contacts 44 of the clip holders 34 are integrated together by a middle section 54 (shown generally by the arrow 54 in FIG. 2). This enables the clip holders 34 to be manufactured in a low cost, high volume manner by simply cutting metal stock (e.g., stamping steel or copper alloy, casting and/or routing aluminum, etc.), to form a metal part, and subsequently molding non-conductive material (e.g., plastic, ceramic material, etc.) around the metal part. In some arrangements, the surface mount contacts 44 are then plated (e.g., with nickel, nickel/copper, gold, tin/silver, etc.) to improve solderability (i.e., solder wetting) of the contacts 44. In some arrangements, some of the middle section 54 remains exposed within the cavity 52 thus enabling the clip holder 34 to electrically connect the clip 36 and the heat sink 32 to the circuit board 22 (i.e., to a ground reference) to form an electromagnetic interference (EMI) shield for the circuit board component 24 when the heat sink assembly 26 is installed over the component 24.

As mentioned above, the clip holders 34 are configured for installation onto the circuit board 22 during an SMT soldering processing. During this process, solder paste is printed over the surface mount pads 28 (e.g., using a stencil), circuit board components are placed over the circuit board 22 and in contact with the printed solder paste (e.g., items such as the component 24 and the clip holders 34 are positioned over the circuit board 22 using automated pick-and-place equipment), and heat is applied (e.g., the circuit board 22 passes through an oven to form the solder joints 30, also see FIG. 1). To this end, the surface mount contacts 44 of the clip holders 34 define a plane which is substantially parallel to the plane of the circuit board 22 when the clip holders 34 mount to the surface mount pads 28 of the circuit board 22 (see the X-Y plane in FIGS. 1 and 2). The planar shape of the surface mount contacts 44 provides an extended surface area that enables the clip holders 34 to remain stable and robustly solder to the surface mount pads 28 of the circuit board 22 during the SMT soldering process.

Additionally, the surface mount contacts 44 of the clip holders 34 further define apertures 56 which extend in a direction that is substantially perpendicular to the plane (see the Z-axis in FIGS. 1 and 2). The apertures 56 allow gas to percolate through the surface mount contacts 44 during the soldering process. In particular, as the solder paste heats up during formation of the solder joints 30, solder within the solder paste becomes molten and flux impurities within the solder paste volatize. At this point, gases escape through the apertures 56 and some of the molten solder wets to the surface mount contacts 44 within the apertures for enhanced integration with the surface mount contacts 44 as the intermetallic layers of the solder joints 30 form. Since the clip holders 34 mount to the circuit board 22 using the same SMT soldering process as the other circuit board components, a secondary step of soldering heat sink parts (e.g., a subsequent manual soldering operation as in the earlier-described conventional anchor-in-hole approach) is unnecessary. Further details of the invention will now be provided with reference to FIGS. 3 and 4.

Figure 3:
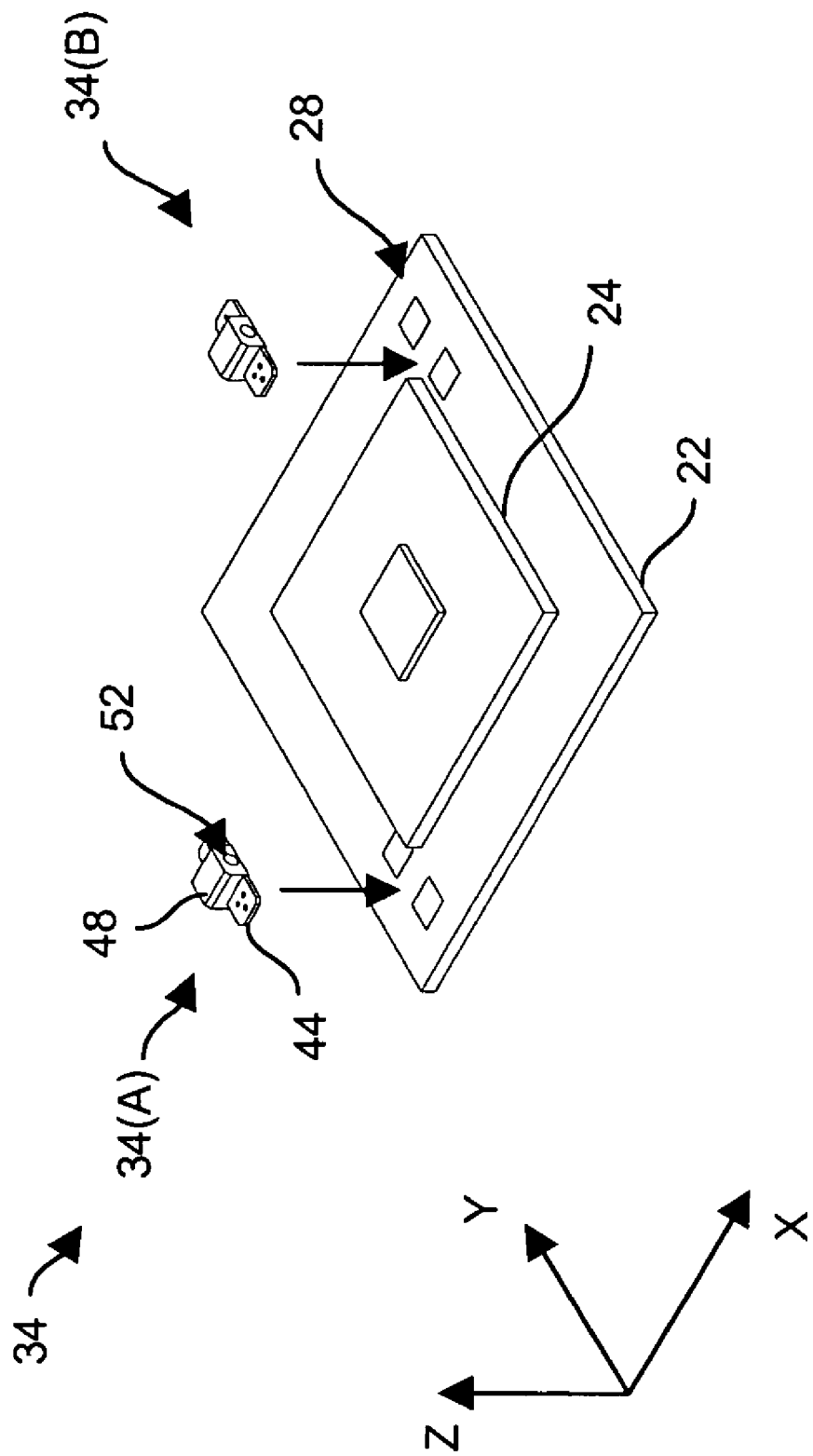
FIG. 3 is a detailed perspective view of heat sink clip holders of the heat sink assembly of FIG. 2 when positioned over sets of surface mount circuit board pads.
Figure 4:
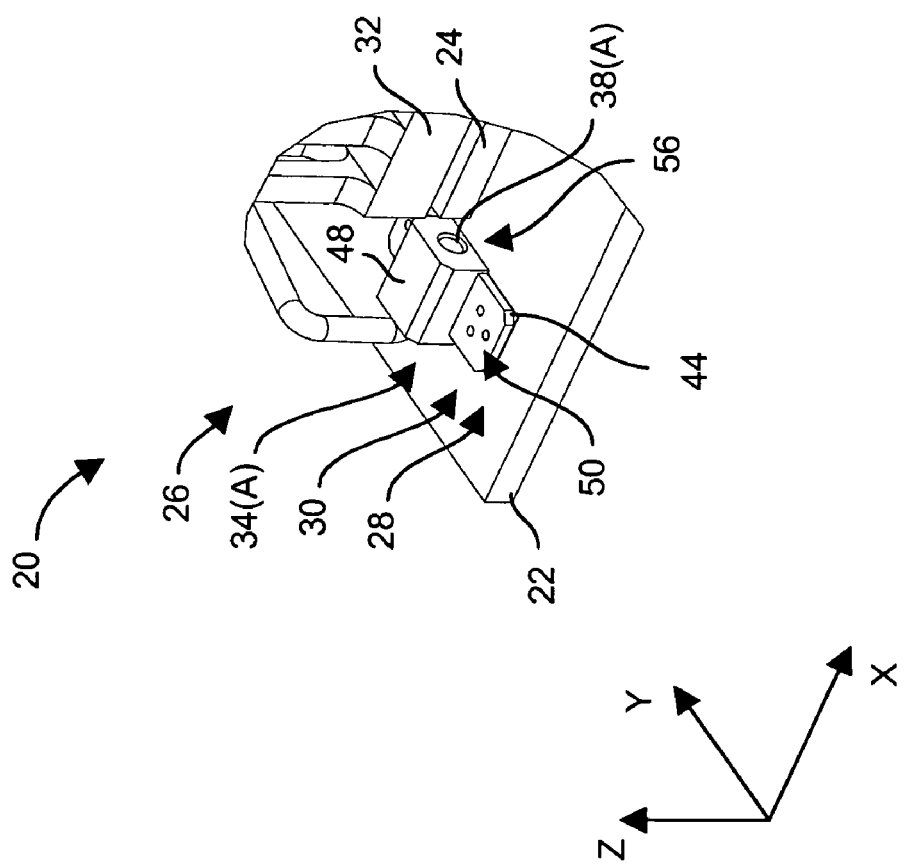
FIG. 4 is a detailed perspective view of a heat sink clip holder of FIG. 3 when soldered to the set of surface mount circuit board pads using a surface mount soldering process and during operation.

FIG. 3 shows the clip holders 34 of the heat sink assembly 26 when positioned over surface mount pads 28 of the circuit board 22 prior to installation. FIG. 4 shows one of the clip holders 34 robustly mounted to the circuit board 22. As shown in FIGS. 3 and 4, each surface mount contact 44 aligns with a corresponding surface mount pad 28 of the circuit board 22. Preferably, the profiles of the surface mount contacts 44 mirror corresponding surface mount pads 28 (e.g., rectangles, hexagonals, rectangles with rounded corners, etc.) to form robust solder joints 30 with healthy reliable fillets that resist fracturing and fatiguing.

As further shown in FIGS. 3 and 4, the cavities 52 defined by the clip holder bodies 48 reside substantially parallel to the plane of the circuit board 22 following installation (e.g., the cavities extend in the X-direction parallel to the X-Y plane). Such orientation of the cavities 52 encourages a user to first position the clip 36 relative to the heat sink 32, and then to insert the ends of the clip 36 laterally into the clip holders 34. This installation scheme avoids uncontrolled twisting of the clip 36 by placing restrictions on the degrees of freedom for the clip 36 thus reducing or even eliminating the likelihood that user will apply too much force and inadvertently pry a clip holder 34 from the circuit board 22 during heat sink installation. Rather, the orientation of the cavities 52 motivates the user to provide only lateral forces on the clip holders 34 (e.g., in the X-direction), i.e., along the plane of circuit board 22. Rotating the arm of the wire clip 36 into position with the clip holder 34 eliminates or reduces the prying force generated as a result of the moment during clip installation. Further details of the invention will now be provided with reference to FIG. 5.

Figure 5:
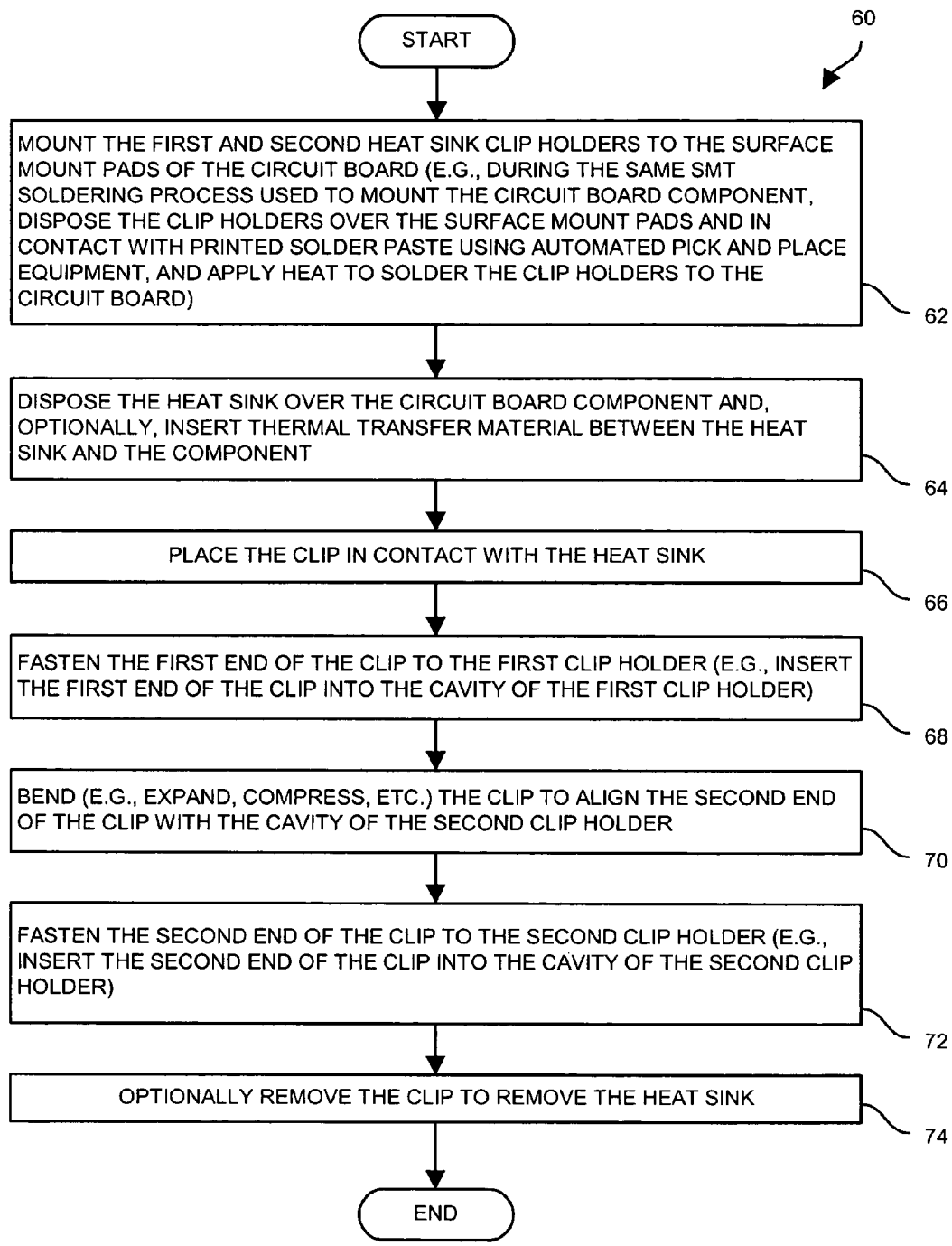
FIG. 5 is a flowchart of a procedure for installing the heat sink assembly of FIG. 2.

FIG. 5 is a flowchart of a procedure 60 which is performed by a user (e.g., a manufacturer of the circuit board module 20) when installing the heat sink assembly 26. In step 62, the user mounts the first and second clip holders 34(A), 34(B) to the surface mount pads 28 of the circuit board 22 using an SMT soldering process. In some arrangements, mounting of the clip holders 34 occurs simultaneously during circuit board assembly, i.e., while other components (see the component 24 in FIG. 1) are also being mounted to the circuit board 22, thus alleviating the need for an additional soldering step as in a conventional anchor-in-hole approach to mounting a heat sink. To mount the clip holders 34, the user (i) disposes the clip holders 34 over the surface mount pads 28 of the circuit board 22 and in contact with printed solder paste using automated pick and place equipment, and (ii) applies heat to melt the printed solder paste, activate flux within the printed solder paste and percolate gas through apertures 56 defined by the clip holders 34. As a result, the clip holders 34 are robustly soldered to the circuit board 22 (also see FIGS. 1 and 4).

In step 64, after circuit board assembly is completed, the user disposes the heat sink 32 over the circuit board component 24. Optionally, the user disposes thermal transfer material (e.g., foil or gel/paste having a high thermal transfer coefficient) between the heat sink 32 and the component 24 to improve thermal contact between the heat sink 32 and the component 24.

In step 66, the user places the clip 36 in contact with the heat sink 32. In one arrangement, the heat dissipation portion 42 of the heat sink 32 includes a set of elongated fins, and the user inserts the middle portion 38(C) of the clip 36 between the fins.

In step 68, the user fastens the first end 38(A) of the clip 36 to the first clip holder 34(A). In particular, the user slides the first end 38(A) into the cavity 52 defined by the body 48 of the first clip holder 34(A).

In step 70, the user bends the clip 36 to align the second end 38(B) of the clip 36 with the cavity 52 defined by the body 48 of the second clip holder 34(B). In one arrangement, in which the end portions 38(A), 38(B) inwardly face each other (see FIGS. 1 and 2), the user expands the end portions 38(A), 38(B) when bending the clip 36. In another arrangement, in which the end portions 38(A), 38(B) face outwardly away from each other, the user compresses the end portions 38(A), 38(B) toward each other when bending the clip 36.

In step 72, the user fastens the second end 38(B) of the clip 36 to the second clip holder 34(B). Due to the controlled movement of the clip 36, unintended twisting of the clip 36 is avoided. As a result, the clip 34 reliably and robustly positions the heat sink 32 adjacent the circuit board component 24.

In step 74, the user optionally remove the clip 36 by bending the clip 36 thus releasing the heat sink 32 if desired, e.g., to inspect or replace the component 24. Since no adhesive was needed to mount the heat sink 32 to the component 24, the heat sink 32 can be reattached to the component 24 or a new component.

It should be understood that the locations of the clip holders 34 as well as the shape and size of the clip 36 and the clip holders 34 provide for flexibility and scalability for a variety of heat sink mounting applications and situations (e.g., small component packages, large component packages, differing locations available for mounting the clip holders 34, differing number of clip holders 34 with custom shaped wire clip, etc.). In particular, the tension of the clip 36 against the heat sink 32 and, thus, amount of force applied on the heat sink 32 against the component 24 is capable of being precisely controlled (e.g., 2.5 pounds of force on an ASIC) for each application. Additionally, the material for the clip 36 can be selected to avoid significant fatiguing over time. Moreover, even in the event of fatigue, the clip 36 is easily replaceable.

As described above, embodiments of the invention are directed to techniques for installing a heat sink 32 using SMT. Such techniques involve the use of (i) heat sink clip holders 34 which solder to a circuit board 22 using an SMT soldering process, and (ii) a clip 36 which subsequently fastens to the heat sink clip holders 34 to properly position the heat sink 32 relative to a circuit board component 24 mounted to the circuit board 22. As a result, there is no adhesive required and the heat sink 32 is removable if desired (e.g., during a rework process). Furthermore, there is no need to sacrifice real estate in the inner layers of the circuit board for any standoffs or anchors.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the circuit board 22 was described and shown above as having a single circuit board component 24 for simplicity and by way of example only. In other arrangements, the circuit board 22 include multiple circuit board components (e.g., integrated circuits, discreet components, etc.). In some arrangements, the heat sink 32 is positioned over multiple components in order to cooling multiple components simultaneously.

Additionally, it should be understood that the heat sink assembly 26 was described above as including two heat sink clip holders 34 and a single clip 36 by way of example only. In other arrangements, multiple clips 36 are employed to fasten the heat sink 32. In such arrangements, the heat sink assembly 26 includes more than one clip 36 (e.g., two clips 36, three clips, etc.) and thus more than two heat sink clip holders 34.

Furthermore, it should be understood that each heat sink clip holder 34 was described above as having two SMT contacts 44 by way of example only. In other arrangements, each heat sink clip holder 34 has a different number than two SMT contacts 44 (e.g., one contact 44, three contacts 44, etc.). Fewer than two SMT contacts 44 enables less consumption of circuit board real estate. More than two SMT contacts 44 provides for improved mounting strength of the SMT contacts 44 with the circuit board 22. Such modifications and enhancements are intended to belong to various embodiments of the invention.

What is claimed is:

1. A circuit board module, comprising:
   a circuit board having surface mount pads;
   a circuit board component mounted to the circuit board; and
   a heat sink assembly including:
     a heat sink,
     a first clip holder and a second clip holder, each clip holder being mounted to respective surface mount pads of the circuit board using a surface mount technology soldering process, and
     a clip having a first portion configured to fasten to the first clip holder, a second portion configured to fasten to the second clip holder, and a third portion coupled to the first and second portions, the third portion being configured to position the heat sink adjacent the circuit board component when the first and second portions are respectively fastened to the first and second clip holders;
   wherein each clip holder defines a cavity which is substantially cylindrical in shape;
   wherein the first portion of the clip defines a first tab;
   wherein the second portion of the clip defines a second tab;
   wherein each of the first and second tabs has a substantially cylindrical shape;
   wherein the third portion of the clip is configured to provide spring tension which simultaneously holds (a) the first tab in an inserted position within the cavity defined by the first clip holder and (b) the second tab in an inserted position within the cavity defined by the second clip holder, when the clip holders are mounted to the respective surface mount pads of the circuit board using surface mount technology and when the third portion of the clip positions the heat sink adjacent the circuit board component;
   wherein at least a portion of each clip holder extends beyond an edge of the circuit board component;
   wherein the first clip holder and the second clip holder reside adjacent corners of the circuit board component diagonally opposite each other; and
   wherein the cavities defined by the first and second clip holders are configured to respectively receive the first and second tabs when the first tab moves in a first direction along a first axis and the second tab moves in a second direction along a second axis, the first and second axes being substantially parallel to each other and the circuit board, and the first and second directions being substantially opposite each other.

2. The circuit board module of claim 1 wherein each clip holder is elongated in shape and includes (i) a first surface mount contact at a first end and (ii) a second surface mount contact at a second end opposite the first end, and wherein the surface mount contacts of each clip holder define apertures which are substantially perpendicular to a plane of the circuit board; and
   wherein each clip holder further includes:
     a non-conductive body portion interconnected between the first and second surface mount contacts of that clip holder, the non-conductive body portion defining a surface to interface with automated pick and place equipment; and
     wherein the non-conductive body portion of each clip holder defines a cavity for fastening with the clip, the cavity extending in a direction that is substantially parallel to the plane.

3. The circuit board module of claim 2 wherein each clip holder further includes:
   an interconnecting conductive portion which electrically interconnects the first and second surface mount contacts of that clip holder, and wherein part of the interconnecting conductive portion is exposed within the cavity defined by the non-conductive body portion of that clip holder.

4. A heat sink assembly, comprising:
   a heat sink;
   a first clip holder and a second clip holder, each clip holder being configured to mount to surface mount pads of a circuit board using a surface mount technology soldering process; and
   a clip having a first portion configured to fasten to the first clip holder, a second portion configured to fasten to the second clip holder, and a third portion coupled to the first and second portions, the third portion being configured to position the heat sink adjacent a circuit board component on the circuit board when the first and second clip holders are mounted to the surface mount pads of the circuit board and when the first and second portions are respectively fastened to the first and second clip holders;
   wherein each clip holder defines a cavity which is substantially cylindrical in shape;
   wherein the first portion of the clip defines a first tab;
   wherein the second portion of the clip defines a second tab;
   wherein each of the first and second tabs has a substantially cylindrical shape;

wherein the third portion of the clip is configured to provide spring tension which simultaneously holds (a) the first tab in an inserted position within the cavity defined by the first clip holder and (b) the second tab in an inserted position within the cavity defined by the second clip holder, when the clip holders are mounted to the respective surface mount pads of the circuit board using surface mount technology and when the third portion of the clip positions the heat sink adjacent the circuit board component;

wherein at least a portion of each clip holder extends beyond an edge of the circuit board component;

wherein the first clip holder and the second clip holder reside adjacent corners of the circuit board component diagonally opposite each other; and wherein the cavities defined by the first and second clip holders are configured to respectively receive the first and second tabs when the first tab moves in a first direction along a first axis and the second tab moves in a second direction along a second axis, the first and second axes being substantially parallel to each other and the circuit board, and the first and second directions being substantially opposite each other.

5. The heat sink assembly of claim 4 wherein:

each clip holder is elongated in shape and includes (i) a first surface mount contact at a first end and (ii) a second surface mount contact at a second end opposite the first end;

the surface mount contacts of each clip holder define a plane which is substantially parallel to the circuit board when that clip holder mounts to the surface mount pads of the circuit board, wherein the surface mount contacts of each clip holder further define apertures which are substantially perpendicular to the plane; and each clip holder further includes a non-conductive body portion interconnected between the first and second surface mount contacts of that clip holder, the non-conductive body portion defining a surface to interface with automated pick and place equipment; and the non-conductive body portion of each clip holder defines a cavity for fastening with the clip, the cavity extending in a direction that is substantially parallel to the plane.

6. The heat sink assembly of claim 5 wherein each clip holder further includes:

an interconnecting conductive portion which electrically interconnects the first and second surface mount contacts of that clip holder, and wherein part of the interconnecting conductive portion is exposed within the cavity defined by the non-conductive body portion of that clip holder.

7. A method for installing a heat sink, the method comprising:

disposing the heat sink over a circuit board component mounted to a circuit board;

fastening a first end of a clip to a first clip holder which is surface mounted to surface mount pads of the circuit board using a surface mount technology soldering process; and fastening a second end of the clip to a second clip holder which is surface mounted to other surface mount pads of the circuit board using the surface mount technology soldering process, the clip positioning the heat sink adjacent the circuit board component when the first and second ends of the clip are fastened to the first and second clip holders which are surface mounted to the surface mount pads of the circuit board;

wherein each clip holder defines a cavity which is substantially cylindrical in shape;

wherein the first end of the clip defines a first tab;

wherein the second end of the clip defines a second tab;

wherein each of the first and second tabs has a substantially cylindrical shape;

wherein the remainder of the clip is configured to provide spring tension which simultaneously holds (a) the first tab in an inserted position within the cavity defined by the first clip holder and (b) the second tab in an inserted position within the cavity defined by the second clip holder, when the clip holders are mounted to the respective surface mount pads of the circuit board using surface mount technology and when the clip positions the heat sink adjacent the circuit board component;

wherein at least a portion of each clip holder extends beyond an edge of the circuit board component;

wherein the first clip holder and the second clip holder reside adjacent corners of the circuit board component diagonally opposite each other; and wherein the cavities defined by the first and second clip holders are configured to respectively receive the first and second tabs when the first tab moves in a first direction along a first axis and the second tab moves in a second direction along a second axis, the first and second axes being substantially parallel to each other and the circuit board, and the first and second directions being substantially opposite each other.

8. The method of claim 7 wherein the second clip holder defines a cavity which extends in a direction that is substantially parallel to a plane of the circuit board; wherein the method further comprises:

after the first end of the clip is fastened to the first clip holder, bending the clip to align the second end of the clip with the cavity defined by the second clip holder.

9. The method of claim 7, further comprising:

mounting the first and second clip holders to the surface mount pads of the circuit board using the surface mount technology soldering process.

10. The method of claim 9 wherein mounting includes:

disposing the first and second clip holders over the surface mount pads of the circuit board and in contact with printed solder paste using automated pick and place equipment; and applying heat to melt the printed solder paste, activate flux within the printed solder paste and percolate gas through apertures defined by the first and second clip holders.

11. The method of claim 7 wherein each clip holder includes:

a first surface mount contact configured to mount to surface mount pads of the circuit board using a surface mount technology soldering process, the first surface mount contact being disposed at a first end of the clip holder;

a second surface mount contact configured to mount to other surface mount pads of the circuit board using the surface mount technology soldering process, the second surface mount contact being disposed at a second end of the clip holder which is opposite the first end; and a body portion interconnected between the first surface mount contact and the second surface mount contact, the body portion being configured to fasten with the clip;

wherein the clip holder is elongated in shape and includes (i) a first surface mount contact at a first end and (ii) a second surface mount contact at a second end opposite the first end;

wherein the surface mount contacts of the clip holder define a plane which is substantially parallel to the circuit board when that clip holder mounts to the surface mount pads of the circuit board, and wherein the surface mount contacts of the clip holder further define apertures which are substantially perpendicular to the plane;

wherein the clip holder further comprises:

a non-conductive body portion interconnected between the first and second surface mount contacts of the clip holder, the non-conductive body portion defining a surface to interface with automated pick and place equipment; and wherein the non-conductive body portion of the clip holder defines a cavity for fastening with the clip, the cavity extending in a direction that is substantially parallel to the plane.

12. The method of claim 11 wherein each clip holder further includes:

an interconnecting conductive portion which electrically interconnects the first and second surface mount contacts of that clip holder, and wherein part of the interconnecting conductive portion is exposed within the cavity defined by the non-conductive body portion of that clip holder.

* * * * *